(12) United States Patent
Yu et al.

(10) Patent No.: US 6,900,653 B2
(45) Date of Patent: May 31, 2005

(54) NEEDLE FIXTURE OF A PROBE CARD IN SEMICONDUCTOR INSPECTION EQUIPMENT AND NEEDLE FIXING METHOD THEREOF

(75) Inventors: Hyun-Sik Yu, Suwon-si (KR); Ji-Man Choi, Suwon-si (KR); In-Dae Shin, Suwon-si (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 28 days.

(21) Appl. No.: 10/613,021

(22) Filed: Jul. 7, 2003

(65) Prior Publication Data

US 2004/0004489 A1 Jan. 8, 2004

(30) Foreign Application Priority Data

Jul. 5, 2002 (KR) .................... 10-2002-0039039

(51) Int. Cl.[7] .............................................. G01R 31/02
(52) U.S. Cl. ...................................... 324/762; 324/754
(58) Field of Search ..................... 324/754, 761–762, 324/72.5; 439/482, 824

(56) References Cited

U.S. PATENT DOCUMENTS

| | | | | |
|---|---|---|---|---|
| 4,599,559 A | * | 7/1986 | Evans | 324/754 |
| 4,965,865 A | * | 10/1990 | Trenary | 324/754 |
| 5,670,889 A | * | 9/1997 | Okubo et al. | 324/760 |
| 5,926,028 A | | 7/1999 | Mochizuki | |

FOREIGN PATENT DOCUMENTS

| | | |
|---|---|---|
| JP | 7-098330 | 4/1995 |
| JP | 9-304436 | 11/1997 |

\* cited by examiner

Primary Examiner—Vinh P. Nguyen
(74) Attorney, Agent, or Firm—Lee, Sterba & Morse, P.C.

(57) ABSTRACT

A needle fixture of a probe card and a needle fixing method in semiconductor inspection equipment include a needle fixture of a probe card in semiconductor inspection equipment including a printed circuit board; a needle fixture installed in the printed circuit board; a resin unit affixing a probe needle to the needle fixture using an adhesive; and a separation preventer for preventing separation of the resin unit from the needle fixture, wherein the separation preventer includes: a plurality of notches formed along a bottom surface of the needle fixture; and the adhesive filling the plurality of notches.

7 Claims, 4 Drawing Sheets

NEEDLE FIXTURE OF A PROBE CARD IN SEMICONDUCTOR INSPECTION EQUIPMENT AND NEEDLE FIXING METHOD THEREOF

BACKGROUND OF THE INVENTION

1. Field of the Invention

The present invention relates to a probe card of semiconductor inspection equipment. More particularly, the present invention relates to a needle fixture of the probe card and a needle fixing method to the probe card using an adhesive wherein the configuration of the needle fixture is changed to strengthen the attachment of the probe needle.

2. Description of the Related Art

In general, a semiconductor memory device is produced by performing two processes. First, a fabrication process for patterning the semiconductor memory device on a wafer is performed. Subsequently, an assembly process for assembling each semiconductor memory device on the wafer to each chip is performed. In addition, before performing the assembly process, an electric die sorting (EDS) process is performed to inspect an electric characteristic of each chip included in a wafer.

In operation, inspection equipment of the EDS process applies an electric signal to each chip on the wafer, and determines whether each chip is a pass, i.e., a good chip, or a fail, i.e., a bad chip, by inspecting the electric signal. Accordingly, the EDS process is able to identify each bad chip fabricated on the wafer. Most inspection equipment includes a probe card having a needle for applying the electric signal to the chip on the wafer. A semiconductor chip (device) determined to be a good chip in the test using the probe card is produced as a final product through a subsequent package process.

During the electric characteristic inspection of a chip of a semiconductor wafer, a needle of a probe card is contacted with an electrode pad of the semiconductor wafer, a measuring current is passed through the needle, and an electric characteristic is measured. Therefore, to measure the electric characteristic of the electrode pad on the wafer accurately, precise contact between the needle and the electrode pad is required.

When a semiconductor chip is tested using a conventional probe card, to ensure the operation reliability, i.e., whether the chip is functional, the temperature of the stage loading a wafer is varied from −40° C. to +125° C. In a conventional probe card, the probe needle is affixed to the needle fixture using an adhesive, such as a synthetic resin. Therefore, due to the temperature variation, the adhesion unit repeatedly contracts and expands, thereby generating a crack in the adhesion unit and thereby causing the probe needle to separate from the needle fixture. As a result, the reliability of the chip test is diminished. Moreover, changing a probe card after the adhesion unit becomes cracked or the probe needle has separated from the needle fixture increases production costs.

SUMMARY OF THE INVENTION

To overcome the above-described problems, it is a first feature of an embodiment of the present invention to provide a needle fixture of a probe card of semiconductor inspection equipment that improves the performance of an adhesion unit for affixing a probe needle to a needle fixture, to prevent a crack of the adhesion unit, or to inhibit separation of the adhesion unit from the needle fixture. It is a second feature of an embodiment of the present invention to provide a needle fixing method in a probe card of semiconductor inspection equipment fixing a probe needle to a needle fixture using an adhesive.

To provide the first feature of an embodiment of the present invention, there is provided a needle fixture of a probe card in semiconductor inspection equipment including a printed circuit board; a needle fixture installed in the printed circuit board; a resin unit affixing a probe needle to the needle fixture using an adhesive; and a separation preventer for preventing separation of the resin unit from the needle fixture, wherein the separation preventer includes: a plurality of notches formed along a bottom surface of the needle fixture; and the adhesive filling the plurality of notches.

To provide the second feature of an embodiment of the present invention, there is provided a needle fixing method in a probe card of semiconductor inspection equipment fixing a probe needle to a needle fixture using an adhesive, including forming a plurality of notches along a bottom surface of the needle fixture; depositing a first resin layer on the bottom surface of the needle fixture to cover and fill the plurality of notches; depositing a second resin layer on a predetermined position of the probe needle; contacting an exposed bottom surface of the first resin layer with an exposed upper surface of the second resin layer; and heating the first and the second resin layers to melt and fuse the first and second resin layers.

Further, depositing the first resin layer may include depositing the first resin layer to a uniform predetermined thickness over and in the plurality of notches on the bottom surface of the needle fixture.

Preferably, the adhesive is an epoxy resin. Preferably, the plurality of notches are formed along the entire bottom surface of the needle fixture.

In a preferred embodiment of the present invention, a side sectional shape of the plurality of notches is a polygon. More specifically, the polygon may be a trapezoid.

In an alternate embodiment of the present invention, a side sectional shape of the plurality of notches is a curve. More specifically, the curve may have the shape of the Greek letter "Ω".

BRIEF DESCRIPTION OF THE DRAWINGS

To provide a more complete understanding of the present invention and the features and advantages thereof, reference is now made to the following descriptions taken in conjunction with the accompanying drawings, in which like reference numerals denote like elements, and in which.

DETAILED DESCRIPTION OF THE INVENTION

Korean Patent Application No. 2002-39039, filed Jul. 5, 2002, and entitled: "Needle Fixture of a Probe Card in Semiconductor Inspection Equipment and Needle Fixing Method Thereof," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art.

Figure 1A:
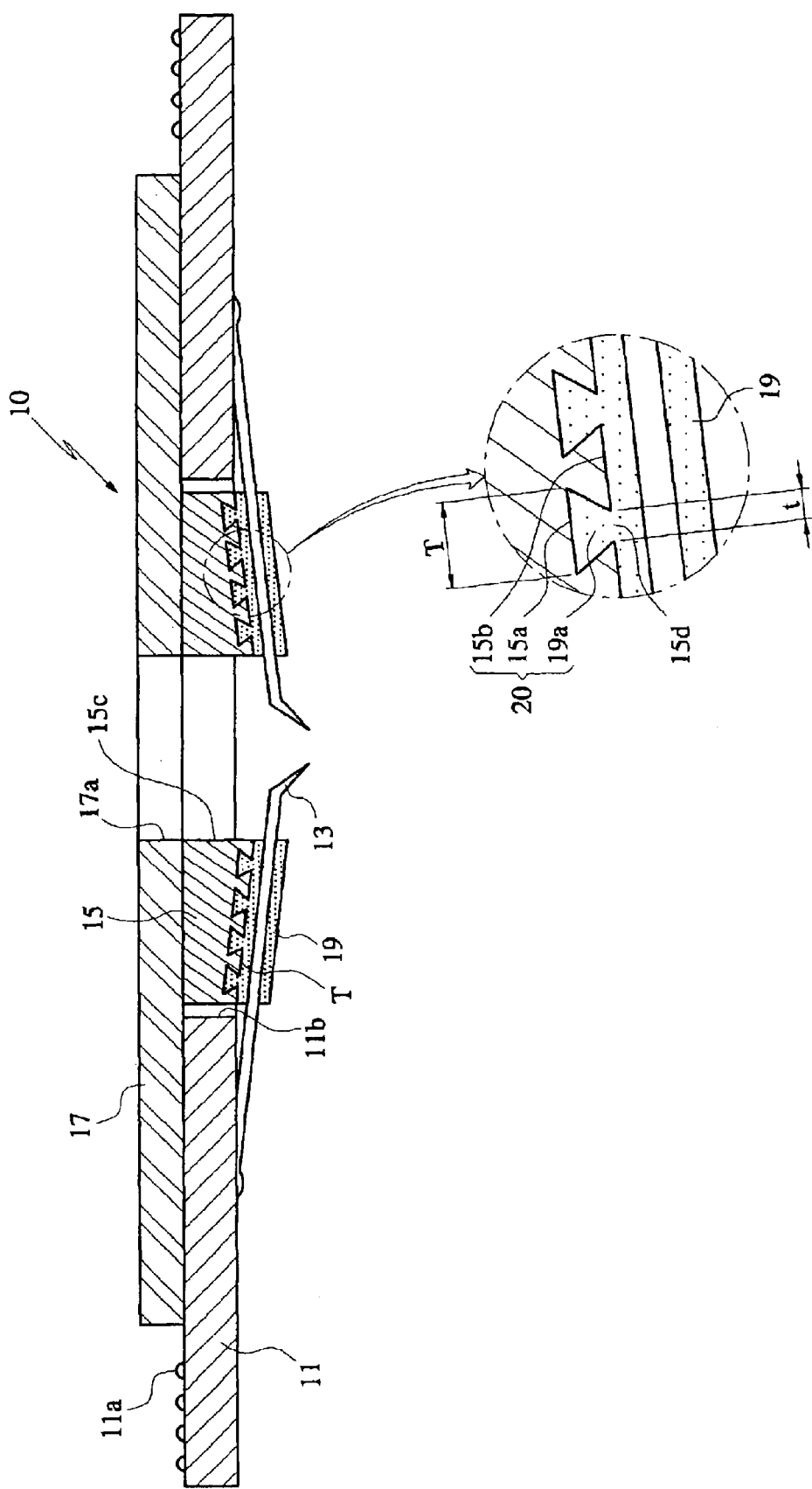
FIG. 1A illustrates a configuration of a probe card according to a preferred embodiment of the present invention.
Figure 1B:
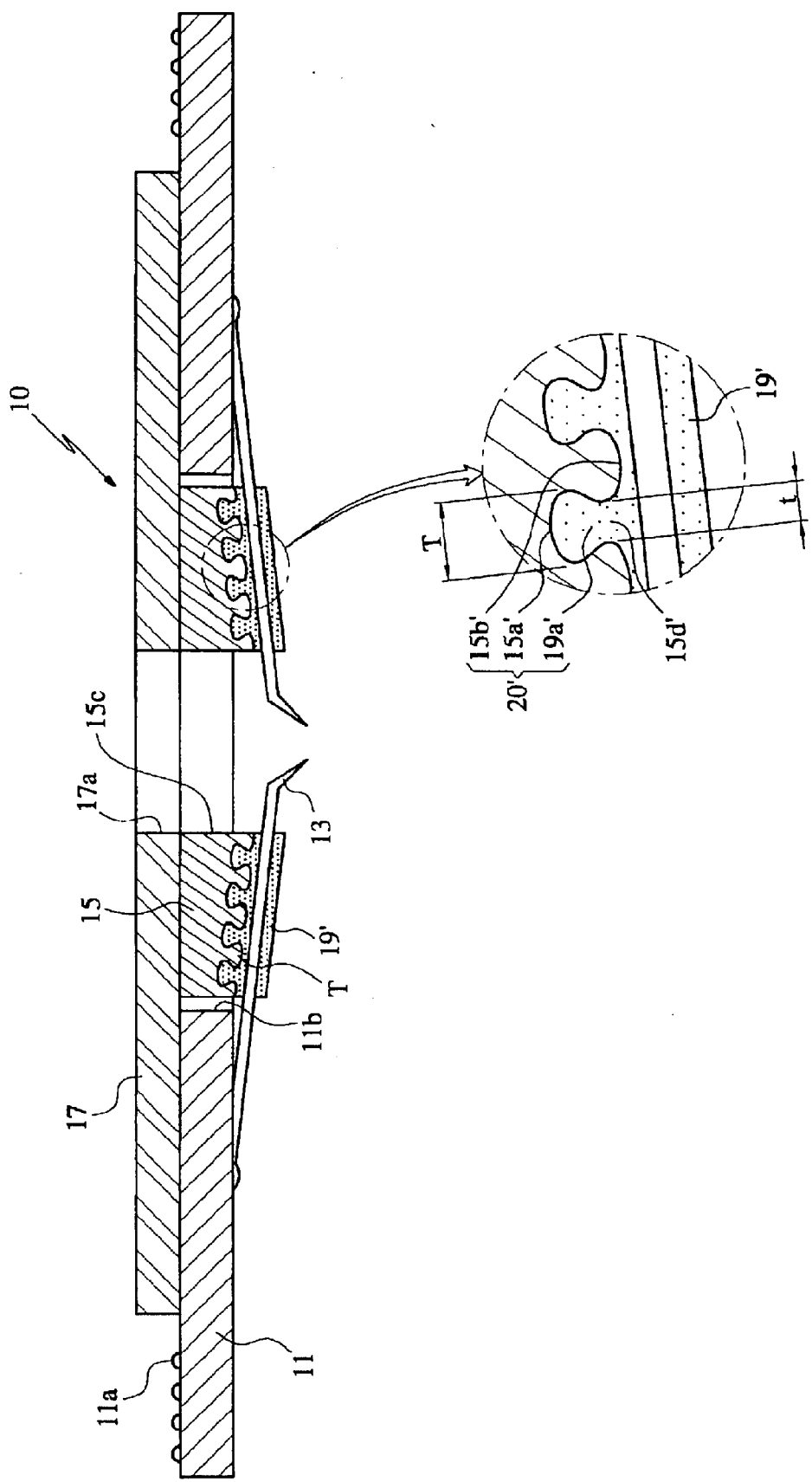
FIG. 1B illustrates a configuration of a probe card according to an alternate embodiment of the present invention.
Figure 2:
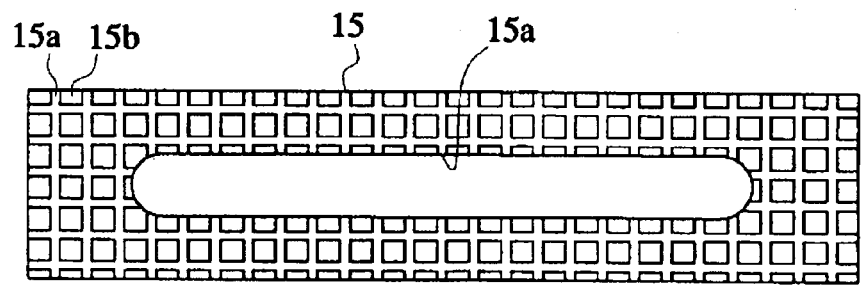
FIG. 2 illustrates a plan view of the bottom of a needle fixture of FIG. 1A.

FIG. 1A illustrates a probe card 10 according to a preferred embodiment of the present invention. FIG. 1B illustrates a probe card 10 according to an alternate embodiment of the present invention. FIG. 2 illustrates a plan view of a bottom of a needle fixture of FIG. 1A.

As shown in FIGS. 1A, 1B, and 2, the probe card 10 includes a printed circuit board 11, a probe needle 13, and a needle fixture 15. The printed circuit board 11 is a ring-shaped insulation plate. The printed circuit board 11 of the probe card includes a plurality of pin connectors 11a, as multiple conductive objects, formed thereon. A probe needle 13 is installed at a bottom surface of the printed circuit board 11 through an intermediate needle fixture 15. The probe needle 13 applies an electric current to measure an electric characteristic when the probe needle 13 is contacted with an electric pad of a wafer.

The printed circuit board 11 further includes a device identification hole 11b for identifying a semiconductor device contacted with the middle of the printed circuit board 11, wherein the device identification hole 11b fixes the needle fixture 15 through an intermediate supporting plate 17. The middle portion of the supporting plate 17 and the needle fixture 15 also include corresponding identification holes 17a and 15c, respectively.

A bottom of the needle fixture 15 is sloped at a predetermined degree. The probe needle 13 is affixed to the needle fixture 15 at a predetermined degree corresponding to the slope using an adhesive or a resin 19, such as an epoxy resin. A rear of the probe needle 13 is connected with a pattern (not shown) of the printed circuit board 11. A surface of the needle fixture 15 that is in contact with the resin 19 has a separation preventer 20 for preventing separation of the resin 19 from the bottom of the needle fixture 15.

The separation preventer 20 includes a plurality of notches 15a and corresponding tabs 15b formed along a bottom surface of the needle fixture 15. A resin unit 19a fills each of the plurality of notches 15a. The plurality of notches 15a increase the contact area with the resin 19, and are preferably formed along the entire bottom surface of the needle fixture 15. A side sectional shape of the plurality of notches 15a may be a polygon, preferably a trapezoid. Each of the plurality of notches 15a includes an opening 15d therein.

In FIG. 1B, an alternate embodiment of the separation preventer 20' includes a plurality of notches 15a' and corresponding tabs 15b' formed along a bottom surface of the needle fixture 15. In this alternate embodiment, the plurality of notches 15a' has a side sectional shape of a curve, preferably, in the shape of the Greek letter omega (Ω). As in the preferred embodiment, a resin unit 19a' fills each of the plurality of notches 15a'. The plurality of notches 15a' increase the contact area with the resin 19', and are preferably formed along the entire bottom surface of the needle fixture 15. In addition, each of the plurality of notches 15a' a includes an opening 15d' therein.

Since a shape of the plurality of notches 15a is a trapezoid or an "Ω" shape 15a', a first width "T" measured along a rear surface opposite the opening 15d or 15d' is larger than a second width "t," which is the distance of the opening 15d or 15d'. Accordingly, the resin unit 19a or 19a' is not easily extracted from the notch 15a or 15a'. When the resin 19 or 19' is contracted in the case of a low temperature test, the trapezoidal or omega-shape of the notches in the separation preventer exhibits enhanced effects.

Figure 3:
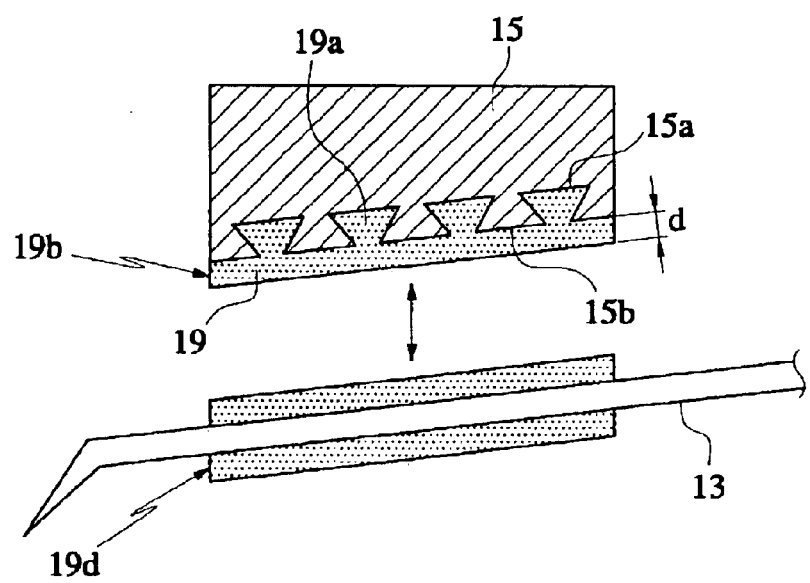
FIG. 3 illustrates a method for adhering a probe needle to the needle fixture of FIG. 1A.

FIG. 3 illustrates a method for adhering a probe needle 13 to the bottom of the needle fixture 15 using an adhesive or a resin 19, such as an epoxy resin.

As shown in FIG. 3, the plurality of notches 15a are formed along the bottom surface of the needle fixture 15. The bottom surface of the needle fixture 15, including the plurality of notches 15a, is covered with the resin 19 to form a first resin layer 19b. While coating the bottom surface of the needle fixture 15 to a predetermined uniform thickness "d," the first resin layer 19b fills each of the notches 15a with a resin unit 19a. The first resin layer 19b coated on the bottom surface of the needle fixture 15 and the plurality of notches 15a forms a smooth, planar surface.

In addition, another jig fixes the probe needle 13 and a second resin layer 19d is formed at a predetermined position on the probe needle 13. After depositing the first and the second resin layers 19b and 19d, an exposed upper surface of the second resin layer 19d is contacted with an exposed bottom surface of the first resin layer 19b, and then the first and the second resin layers 19b and 19d are heated to a predetermined temperature. Thus, the first and the second resin layers 19b and 19d become melted and fused, thereby affixing the probe needle 13 to the needle fixture 15.

Figure 4:
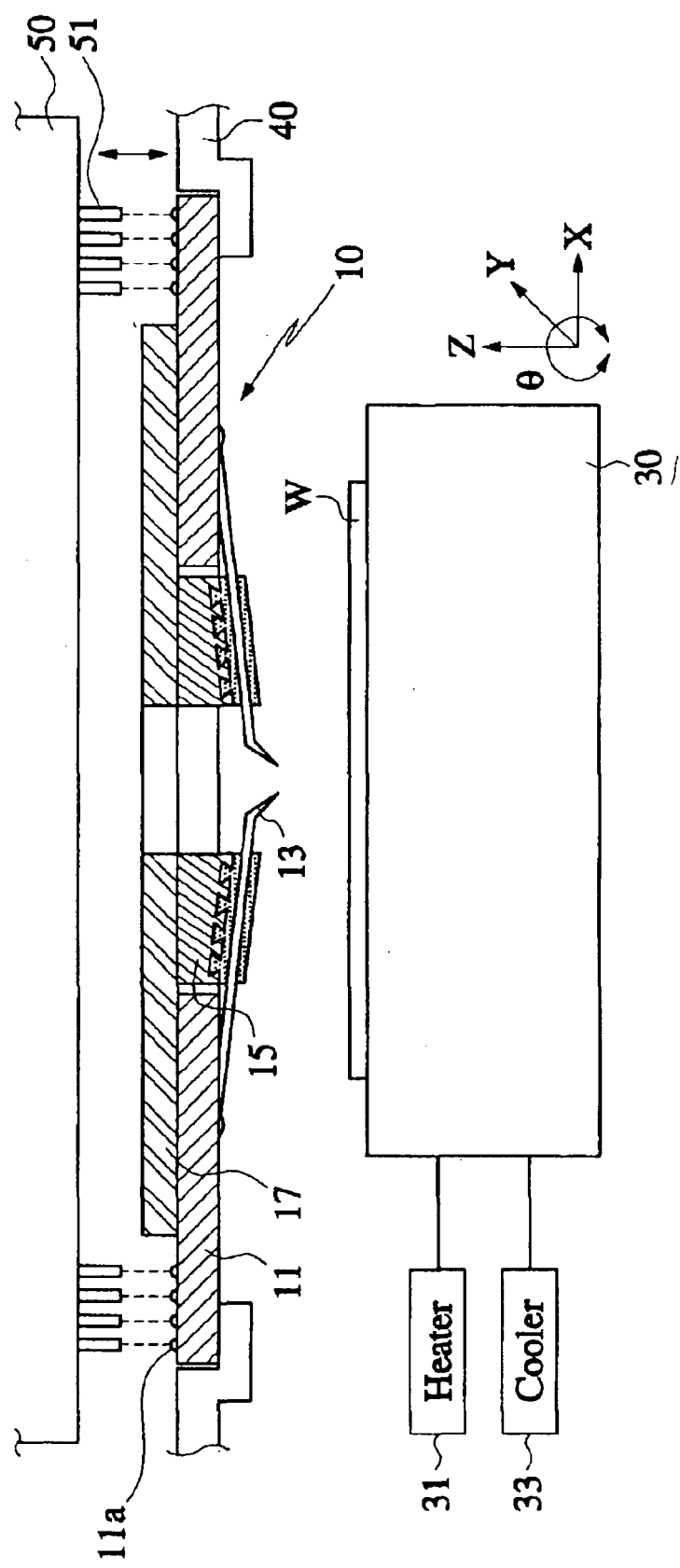
FIG. 4 is a schematic diagram of semiconductor inspection equipment applying the probe card of FIG. 1A.

FIG. 4 is a schematic diagram of semiconductor inspection equipment including the above-described probe card 10 according to an embodiment of the present invention. As shown in FIG. 4, at the bottom of the probe card 10, a wafer chuck 30 for loading an object to be inspected, e.g., a wafer W, is included. A driving means (not shown) moves the wafer chuck 30 horizontally in both the x- and y-directions and vertically, up and down, in the z-direction. In addition, the wafer chuck 30 is able to be rotated in a predetermined direction.

The wafer chuck 30 includes a heater 31 and a cooler 33 for heating or cooling a wafer W loaded on the wafer chuck 30 to a predetermined temperature condition, for example, −40° C. to +125° C. The heater 31 and the cooler 33 allow for testing to be performed under various temperature conditions.

In addition, a holder 40 elevates and lowers the probe card 10. A test head 50 for transmitting a test signal is installed in the top of the probe card 10. At a bottom surface of the test head 50, each of a plurality of pins 51 are installed to establish contact with a corresponding one of the plurality of pin connectors 11a of the printed circuit board 11 to transmit an inspection signal.

The operation principle of semiconductor inspection equipment including a probe card 10 according to an embodiment of the present invention will now be described.

Initially, the test head 50 is placed in a predetermined position. The holder 40 then lifts the probe card 10 and the plurality of pins 51 at the bottom surface of the test head 50 are each contacted with a corresponding pin connector 11a of the printed circuit board 11 to transmit an electric signal.

Sequentially, a driving means (not shown) elevates the wafer chuck 30, and the electric pad (not shown) of a wafer is contacted with the probe needle 13 to inspect an electric characteristic of semiconductor devices of the wafer. To ensure reliability of the characteristic inspection, the wafer W is tested under various temperature conditions. To accomplish this testing at varying temperatures, the heater 31 or the cooler 33 in the wafer chuck 30 heats or cools the wafer.

According to changes in the ambient temperature, the resin 19 fixing the probe needle 13 contracts or expands repeatedly. As a result, a crack is generated and the probe needle 13 may become separated from the needle fixture 15. The separation of the resin 19 can be prevented by the plurality of notches 15a in the needle fixture 15, and by the resin unit 19a filling the notches 15a. More specifically, the plurality of notches 15a increase the contact area with the resin 19 to prevent separation of the resin 19.

Particularly, when the plurality of notches 15a are formed along the entire bottom surface of the needle fixture 15, the contact area is further increased so that the resin 19 may be affixed to the needle fixture 15 more securely.

As shown in FIG. 3, when the side sectional shape of the plurality of notches 15a is a trapezoid, as illustrated in FIG. 1A, or an "Ω" shape, as illustrated in FIG. 1B, the resin unit 19a or 19a' is not easily separated when the resin 19 or 19' is contracted under low temperature testing conditions.

Even though the above description is refined to a case wherein the probe needle is a cantilever-type, the present invention may be applied to various types of probe cards using a resin to affix the probe needle.

As described above, in a probe card affixing a probe needle to a needle fixture using a resin, which may be a synthetic resin, the present invention embodies the probe card maximizing the contact area between the resin and the needle fixture. Therefore, the probe card of the present invention prevents separation of the resin from the needle fixture to affix the probe needle more securely.

By fixing the probe needle more securely, the contact between the probe needle and an electrode pad of an object to be inspected, e.g., a semiconductor device formed on a wafer, is improved to increase inspection reliability. In addition, by reducing failures in which the probe needle becomes detached from the needle fixture, the need to exchange expensive probe cards, as well as production costs, are reduced.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A needle fixture of a probe card in semiconductor inspection equipment comprising:

a printed circuit board;

a needle fixture installed in the printed circuit board;

a resin unit affixing a probe needle to the needle fixture using an adhesive; and a separation preventer for preventing separation of the resin unit from the needle fixture, wherein the separation preventer includes:

a plurality of notches formed along a bottom surface of the needle fixture; and the adhesive filling the plurality of notches.

2. The needle fixture of the probe card according to claim 1, wherein the adhesive is an epoxy resin.

3. The needle fixture of the probe card according to claim 1, wherein the plurality of notches are formed along the entire bottom surface of the needle fixture.

4. The needle fixture of the probe card according to claim 1, wherein a side sectional shape of the plurality of notches is a polygon.

5. The needle fixture of the probe card according to claim 4, wherein the polygon is a trapezoid.

6. The needle fixture of the probe card according to claim 1, wherein a side sectional shape of the plurality of notches is a curve.

7. The needle fixture of the probe card according to claim 6, wherein the curve has the shape of the Greek letter "Ω".

* * * * *